United States Patent
Chen et al.

(10) Patent No.: US 10,276,443 B2
(45) Date of Patent: Apr. 30, 2019

(54) INSULATING LAYER NEXT TO FIN STRUCTURE AND METHOD OF REMOVING FIN STRUCTURE

(71) Applicant: UNITED MICROELECTRONICS CORP., Hsin-Chu (TW)

(72) Inventors: Shin-Chi Chen, Penghu County (TW); Chih-Chung Chen, Tainan (TW); An-Chi Liu, Tainan (TW); Chih-Yueh Li, Taipei (TW); Pei-Ching Yeh, Changhua County (TW); Tsung-Chieh Yang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 9 days.

(21) Appl. No.: 15/445,928

(22) Filed: Feb. 28, 2017

(65) Prior Publication Data

US 2018/0226403 A1    Aug. 9, 2018

(30) Foreign Application Priority Data

Feb. 9, 2017  (CN) .......................... 2017 1 0070806

(51) Int. Cl.
| | | |
|---|---|---|
| *H01L 21/8234* | (2006.01) | |
| *H01L 27/088* | (2006.01) | |
| *H01L 29/06* | (2006.01) | |
| *H01L 21/311* | (2006.01) | |
| *H01L 21/3065* | (2006.01) | |
| *H01L 21/308* | (2006.01) | |

(Continued)

(52) U.S. Cl.
CPC .. *H01L 21/823431* (2013.01); *H01L 21/3065* (2013.01); *H01L 21/3081* (2013.01); *H01L 21/30604* (2013.01); *H01L 21/31133* (2013.01); *H01L 21/31144* (2013.01); *H01L 21/76224* (2013.01); *H01L 21/823481* (2013.01); *H01L 27/0886* (2013.01); *H01L 29/0649* (2013.01); *H01L 29/66795* (2013.01); *H01L 29/7851* (2013.01)

(58) Field of Classification Search
CPC .......... H01L 27/0886; H01L 21/30604; H01L 21/3065; H01L 21/3081; H01L 21/31133; H01L 21/31144; H01L 21/823431; H01L 29/0649; H01L 21/76224; H01L 21/823481
See application file for complete search history.

(56) References Cited

U.S. PATENT DOCUMENTS 8,617,996 B1 * 12/2013 Chi ................... H01L 21/30604
                                                    257/E21.377
2005/0230348 A1 * 10/2005 Kido ................... H01L 21/0273
                                                    216/58

(Continued)

*Primary Examiner* — Feifei Yeung Lopez
(74) *Attorney, Agent, or Firm* — Winston Hsu

(57) ABSTRACT

A method of removing a fin structure includes providing a substrate. A fin structure extends from the substrate. A mask layer is disposed on a top surface of the fin structure. An organic dielectric layer covers the substrate, the fin structure and the mask layer. A first etching process is performed to entirely remove the mask layer by taking the organic dielectric layer as a mask. Then a second etching process is performed to remove the fin structure. The first etching process is preferably an anisotropic etching process, and the second etching process is an isotropic etching process.

7 Claims, 4 Drawing Sheets

(51) Int. Cl.
*H01L 21/306* (2006.01)
*H01L 21/762* (2006.01)
*H01L 29/66* (2006.01)
*H01L 29/78* (2006.01)

(56) References Cited

U.S. PATENT DOCUMENTS

| | | | |
|---|---|---|---|
| 2013/0277759 A1* | 10/2013 | Chen | H01L 21/82343 |
| | | | 257/397 |
| 2014/0065828 A1 | 3/2014 | Choi | |
| 2015/0206954 A1* | 7/2015 | Lin | H01L 29/66795 |
| | | | 257/365 |
| 2016/0056045 A1 | 2/2016 | Huang | |
| 2016/0268142 A1* | 9/2016 | Liou | H01L 21/0337 |

* cited by examiner

INSULATING LAYER NEXT TO FIN STRUCTURE AND METHOD OF REMOVING FIN STRUCTURE

BACKGROUND OF THE INVENTION

1. Field of the Invention

The present invention relates to a method of removing a fin structure, and more particularly to a method of removing a fin structure by two different etching processes.

2. Description of the Prior Art

Transistors, such as metal oxide semiconductor field-effect transistors (MOSFETs), are the core building block of the vast majority of semiconductor devices. Some semiconductor devices, such as high performance processor devices, can include millions of transistors. For such devices, scaling down the size of the transistors to thus increase transistor density has traditionally been a high priority in the semiconductor manufacturing industry. This scaling down process provides the benefits of increased production efficiency and lowered associated costs.

Such scaling down, however, has also increased the complexity of processing and manufacturing ICs. For the advantages of scaling down to be fully realized, developments in IC processing and manufacturing are needed. A three dimensional transistor, such as a fin-type field-effect transistor (FinFET), has been introduced to replace a planar transistor. Existing FinFET devices and methods of fabricating FinFET devices, although adequate for their intended purposes, have not been entirely satisfactory in all respects. For example, forming fin structures with different densities raise challenges in FinFET process development. In view of the above, it would be an advantage in the art to provide a better method to form fin structures with different densities.

SUMMARY OF THE INVENTION

In one embodiment, an insulating layer is provided next to a fin structure. The insulating layer includes a substrate, a first fin structure extending and protruding from the substrate, a recess embedded in the substrate and adjacent to the first fin structure, and an insulating layer disposed on the substrate, which contacts the first fin structure and fills in the recess.

In another embodiment, a method of removing a fin structure includes the steps of providing a substrate, and providing a fin structure extending from the substrate. A mask layer is disposed on a top surface of the fin structure, and an organic dielectric layer covers the substrate, the fin structure and the mask layer. Later, the organic dielectric layer is patterned so an opening is formed on the organic dielectric layer, wherein the mask layer is exposed by the opening. Subsequently, a first etching process is performed to entirely remove the mask layer by taking the organic dielectric layer as a mask. Finally, a second etching process is performed to remove the fin structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 depict a method of removing a fin structure according to a preferred embodiment of the present invention, wherein:

FIG. 1 depicts a stage of providing a substrate with numerous fin structures;
FIG. 2 is a fabricating stage following FIG. 1;
FIG. 3 is a fabricating stage following FIG. 2;
FIG. 4 is a fabricating stage following FIG. 3;
FIG. 5 is a fabricating stage following FIG. 4.

DETAILED DESCRIPTION

Based on different product requirements, fin structures in different regions will often be arranged in different densities. In other words, fin structures are closer to each other in a high density region, and are farther from each other in a low density region. The fabricating steps of fin structures include etching the substrate. If, however, fin structures in the high density region and in the low density region are formed by a single etching step, the shape of the resultant fin structures will not match the original design due to the loading effect.

To avoid this loading effect, the method of the present invention specially forms fin structures with the same density in all regions. Later, redundant fin structures in the low density region are removed by two different etching processes. In detail, a dry etching process is utilized to remove a mask layer on the fin structure and then a wet etching process removes the entire fin structure. In some circumstances, part of the fin structure is removed in the dry etching process along with the mask layer. If the redundant fin structures are removed by only the dry etching process, an organic dielectric layer covering wanted fin structures adjacent to the redundant fin structures will be removed entirely before the dry etching process is over, causing the wanted fin structures to undergo a dry etch as they are not protected by the organic dielectric layer. By using the two step etching process of the present invention, the wanted fin structures will not be damaged during the removal of the redundant fin structures.

Figure 1:
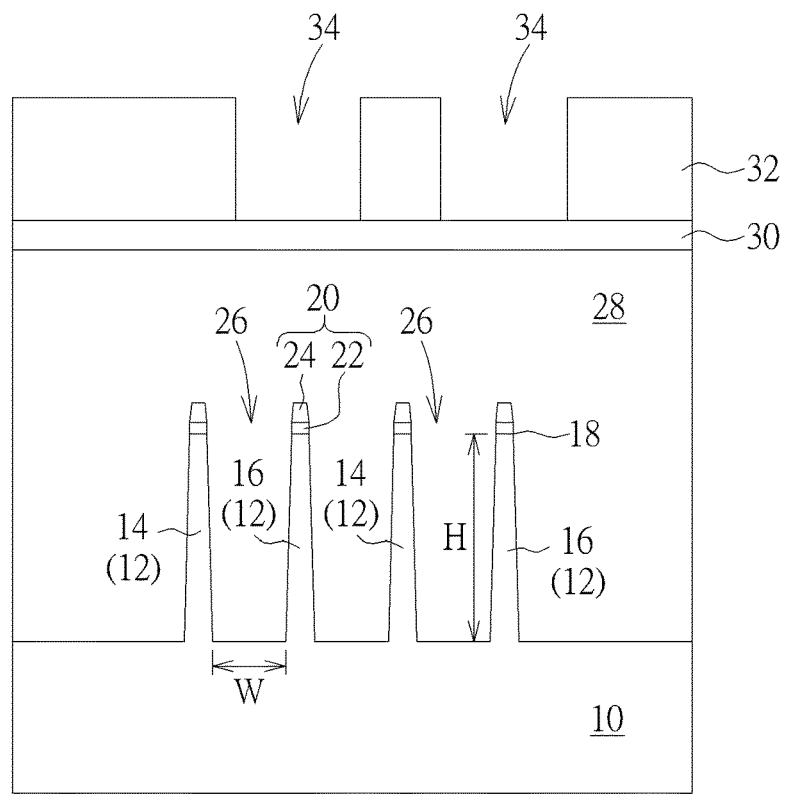

FIG. 1 to FIG. 5 depict a method of removing a fin structure according to a preferred embodiment of the present invention. As shown in FIG. 1, a substrate 10 is provided. The substrate 10 the present invention may be a bulk silicon substrate, a germanium substrate, a gallium arsenide substrate, a silicon germanium substrate, an indium phosphide substrate, a gallium nitride substrate or a silicon carbide substrate. At least a fin structure 12 extends and protrudes from the substrate 10. The number of fin structures 12 may be single or plural, and is exemplified as four in the present invention. The fin structures 12 are further divided into two first fin structures 14 and two second fin structures 16 based on whether the fin structures 12 will be removed or not, wherein the first fin structures 14 will be preserved, and the second fin structures 16 will be removed. The first fin structures 14 and the second fin structures 16 are disposed alternately. The number of the first fin structures 14 and the second fin structures 16 can be altered based on different requirements. The first fin structures 14 and the second fin structures 16 are the same in their material and structure. Therefore, only the material and structure of the second fin structures 16 will be described in the following description. The material of each of the second fin structures 16 is the same as the material of the substrate 10. For example, if the substrate 10 is made of silicon, the second fin structures 16 are made of silicon as well. Each second fin structure 16 includes a top surface 18. The top surface 18 is the highest surface of the second fin structure 16 with respect to the top surface of the substrate 10. A mask layer 20 is disposed on and contacts the top surface 18 of each of the second fin structures 16. A mask layer 20 is also disposed on each of the first fin structures 14. The mask layer 20 may be made of single or multiple materials. The mask layer 20 may include silicon nitride, silicon oxide or silicon oxynitride. In this embodiment, the mask layer 20 is formed by a silicon oxide layer 22 and a silicon nitride layer 24. The silicon oxide layer 22 is below the silicon nitride layer 24. Furthermore, a recess 26 is disposed between the first fin structure 14 and the second fin structure 16 next to the first fin structure 14. A height H of each of the second fin structures 16 is preferably 1200 angstroms. A width W of the recess 26 is preferably smaller than 20 nanometers. An organic dielectric layer 28 is formed to entirely cover the substrate 10, the first fin structures 14 and the second fin structures 16, wherein the organic dielectric layer 28 fills up the recess 26. The organic dielectric layer 28 may contains carbon, hydrogen, and oxygen, but does not contain silicon. The organic dielectric layer 28 is preferably made of homogeneous and non-photosensitive material. Because of the property of the organic dielectric layer 28, the organic dielectric layer 28 can be formed on the substrate 10, the first fin structures 14, and the second fin structures 16 by a spin coating process. In this way, the organic dielectric layer 28 can entirely fill up the recess 26 and have a flat top surface.

Figure 2:
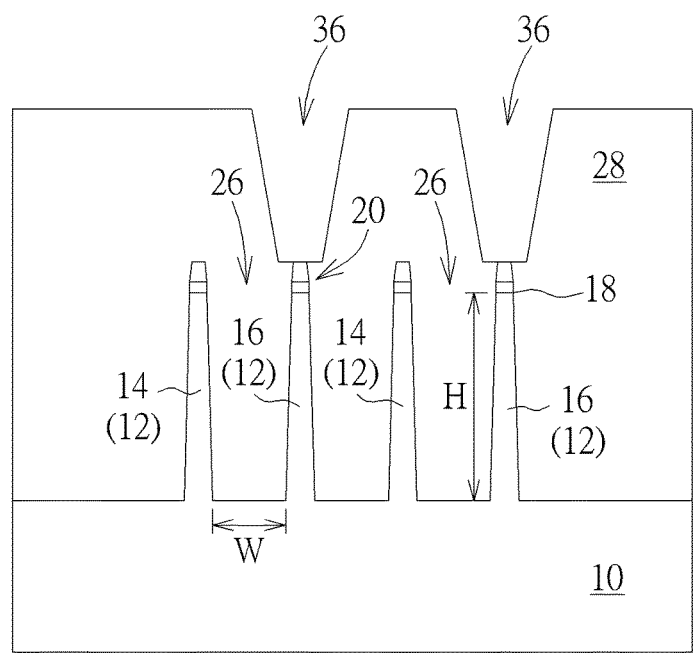

A silicon-containing bottom anti-reflective coating 30 and a photoresist layer 32 are formed to cover the organic dielectric layer 28. Later, the photoresist layer 32 is patterned to form at least one opening 34 within the photoresist layer 32. In this embodiment, the number of openings 34 is exemplified as two. As shown in FIG. 2, the silicon-containing bottom anti-reflective coating 30 and the organic dielectric layer 32 are patterned by taking the photoresist layer 32 as a mask to form at least one opening 36 on the organic dielectric layer 28. Because the photoresist layer 32 serves as the mask when patterning the silicon-containing bottom anti-reflective coating 30 and the organic dielectric layer 32, the number of openings 36 should be the same as the number of openings 34. The mask layer 20 on each of the second fin structures 16 is exposed through the corresponding opening 36. Therefore, one mask layer 20 is exposed through one opening 36. The organic dielectric layer 28 can be patterned by a dry etching process. During the dry etching process, the photoresist layer 32 and the silicon-containing bottom anti-reflective coating 30 are consumed entirely. The etchant in the dry etching process can be hydrogen bromide, chlorine gas or fluorine-containing gas.

Figure 3:
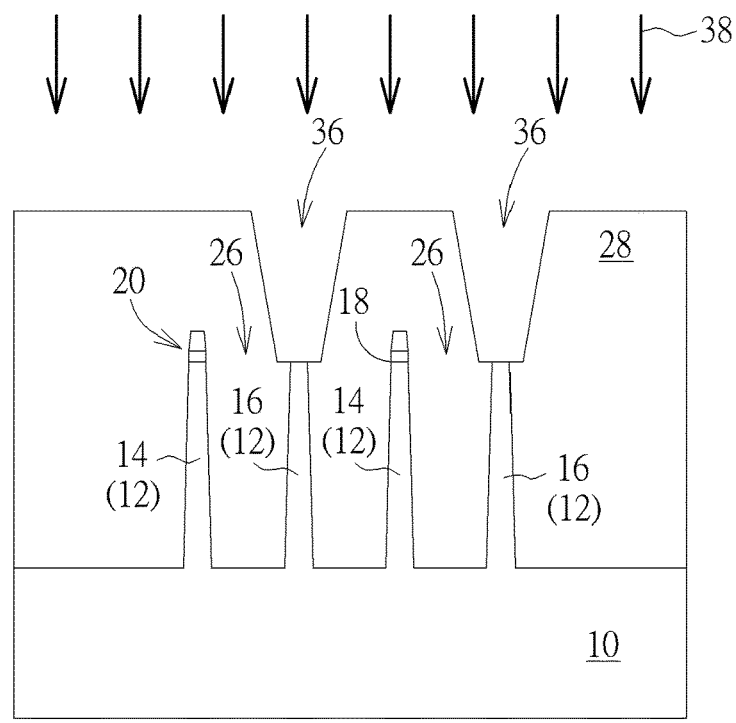
Figure 7:
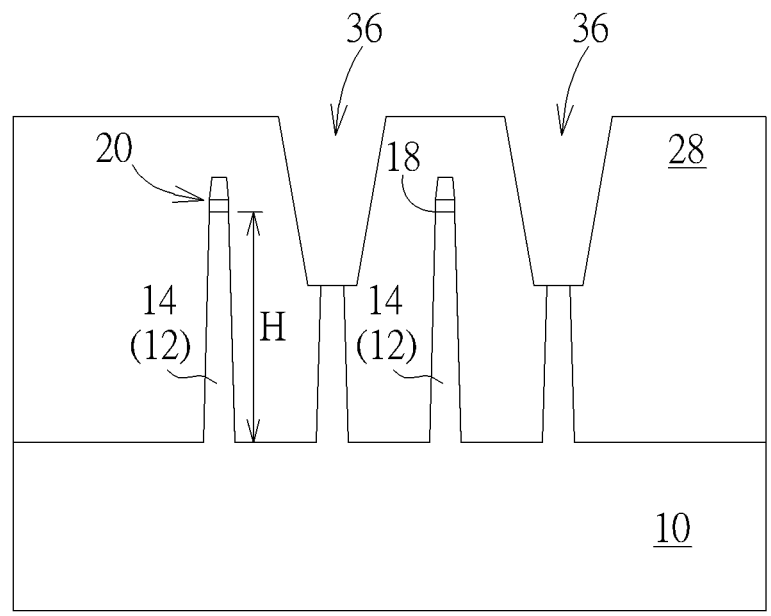
FIG. 7 depicts a method of removing a fin structure according to another preferred embodiment of the present invention.

As shown in FIG. 3, a first etching process 38 is performed by taking the organic dielectric layer 28 as a mask to entirely remove the exposed mask layers 20. The first etching process 38 is preferably an anisotropic etching process such as a dry etching process. The etchant used in the first etching process 38 may be a fluorine-containing gas. After removing the mask layers 20, the second fin structures 16 are exposed through the openings 36. According to another preferred embodiment of the present invention, after removing the mask layers 20 entirely, the first etching process 38 can continue to etch the second fin structures 16. This is shown in FIG. 7. For example, one third of the height H of each of the second fin structures 16 can be removed.

Figure 4:
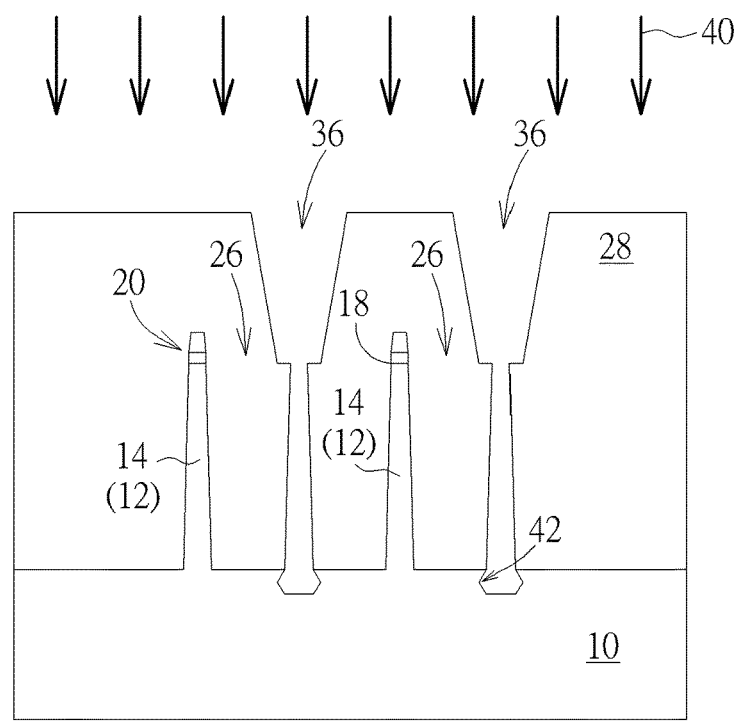
Figure 8:
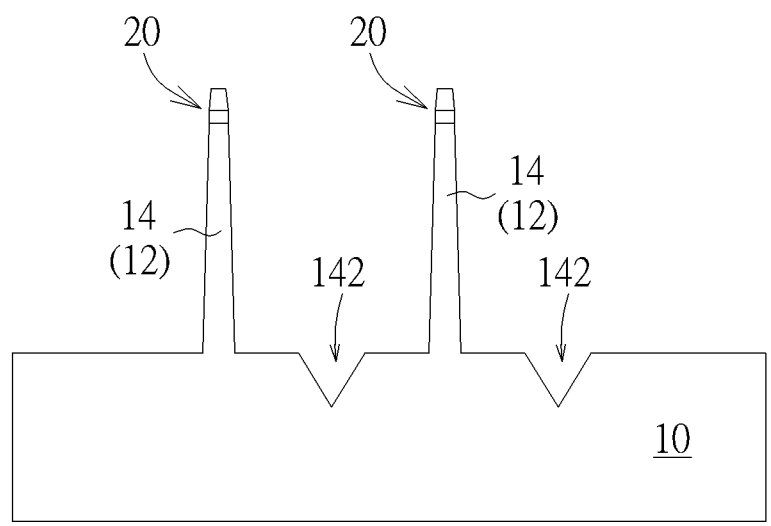
FIG. 8 depicts a recess in a triangular profile.

FIG. 4 continues from FIG. 3. As shown in FIG. 4, a second etching process 40 is performed to entirely remove the second fin structures 16 by taking the organic dielectric layer 28 as a mask. After removing the second fin structures 16, the second etching process 40 continues to etch part of the substrate 10 to form a recess 42 in the substrate 10. According to another preferred embodiment of the present invention, the second etching process 40 stops at the point that the second fin structures 16 are entirely removed. Therefore, no recess will be formed in the substrate 10. Subsequent figures and processes show the recess 42 is formed in the substrate 10 as an example. The second etching process 40 is preferably an isotropic etching process such as a wet etching process or an isotropic dry etching process. If the second etching process 40 is a wet etching process, the etchant can be an alkaline solution or an acidic solution. If an alkaline solution is used, the substrate 10 will be etched along the lattice direction by the alkaline solution to form the recess 42 in a hexagonal profile (as shown in FIG. 4) or to form a recess 142 in a triangular profile (as shown in FIG. 8). If, however, an acidic solution is used or an isotropic dry etching process is used, the substrate 10 will not be etched along the lattice direction. The recess will not form a hexagonal profile or a triangular profile. The alkaline solution may be tetramethylammonium hydroxide (TMAH). It is noteworthy that the organic dielectric layer 28 still covers the substrate 10 while the second fin structures 16 are removed.

Figure 5:
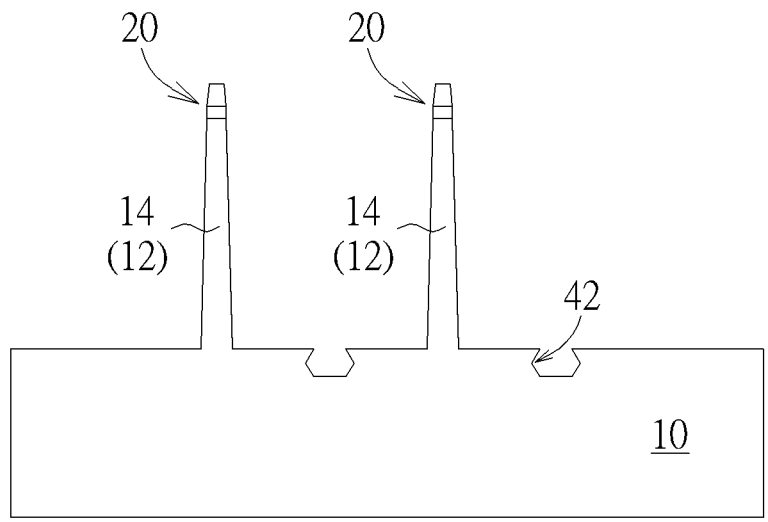
Figure 6:
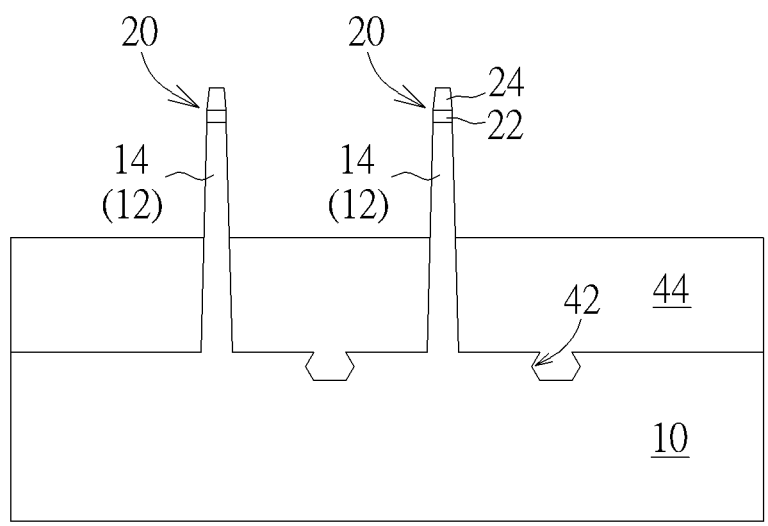
FIG. 6 depicts an insulating layer next to a fin structure.

As shown in FIG. 5, the organic dielectric layer 28 is completely removed. At this point, the method of removing a fin structure of the present invention is completed. As shown in FIG. 6, an insulating layer (not shown) is formed to cover the substrate 10 and the first fin structures 14, and to fill in the recess 42. The insulating layer is preferably silicon oxide. Later, the insulating layer is etched back to a predetermined height to form an insulating layer 44. The insulating layer 44 serves as a shallow trench isolation (STI) at both sides of each of the first fin structures 14. The shallow trench isolation fills up the recess 42. After that, a gate dielectric layer, and a gate electrode can be formed to cross the first fin structures 14. Later, source/drain doping regions can be formed at two sides of the gate electrode in the first fin structures 14. Based on different requirements, the mask layer 20 on the first fin structures 14 can be removed before forming the gate dielectric layer.

The position of the first fin structures 14 and the second fin structures 16 can be altered based on different requirements. The number of the first fin structures 14, the number of the second fin structures 16, and the total number of the first fin structures 14 and the second fin structures 16 can also be altered. For example, there can be two first fin structures 14 arranged in sequence followed by two second fin structures 16 arranged in sequence That is, there will be two recesses 42 side by side with no fin structure disposed between the two recesses 42 after the etching processes. In another case, there can be two first fin structures 14 and one second fin structure 16. In this way, one second fin structure 16 will be removed, while the two first fin structures 14 remain. In addition, the number of the recesses 42 is equal to the number of second fin structures 16.

FIG. 6 depicts an insulating layer next to a fin structure. As shown in FIG. 6, the insulating layer includes a substrate 10. A first fin structure 14 extends and protrudes from the substrate 10. The material of the first fin structure 14 is the same as the material of the substrate 10. For example, if the substrate 10 is made of silicon, the first fin structure 14 is made of silicon as well. A recess 42 is embedded in the substrate 10. The recess 42 is adjacent to the first fin structure 14. The recess 42 has a hexagonal profile or a triangular profile. An insulating layer 44 is disposed on the substrate 10, contacts the first fin structure 14 and fills in the recess 42. Another first fin structure 14 extends and protrudes from the substrate 10. The recess 42 is disposed between the two first fin structures 14. The insulating layer 44 contacts both of the first fin structures 14. The insulating layer 44 includes silicon oxide. A mask layer 20 covers each of the first fin structures 44. The mask layer 20 includes silicon oxide layer 22 and silicon nitride layer 24 disposed from bottom to top.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of removing a fin structure, comprising:
providing a substrate, and a fin structure extending from the substrate, wherein a mask layer is disposed on a top surface of the fin structure, and an organic dielectric layer covers the substrate, the fin structure and the mask layer;
patterning the organic dielectric layer to form an opening on the organic dielectric layer, wherein the mask layer is exposed by the opening;
performing a first etching process to entirely remove the mask layer by taking the organic dielectric layer as a mask, wherein part of the fin structure is removed during the first etching process; and
performing a second etching process to remove the fin structure.

2. The method of removing a fin structure of claim 1, wherein one third of the fin structure is removed during the first etching process.

3. The method of removing a fin structure of claim 1, wherein the second etching process further comprises:
partly removing the substrate to form a recess in the substrate.

4. The method of removing a fin structure of claim 1, wherein the first etching process is an anisotropic etching process.

5. The method of removing a fin structure of claim 4, wherein the first etching process is a dry etching process.

6. The method of removing a fin structure of claim 1, wherein the second etching process is an isotropic etching process.

7. The method of removing a fin structure of claim 6, wherein the second etching process is a wet etching process or an isotropic dry etching process.

* * * * *